United States Patent
Lu et al.

[19]

[11] Patent Number: 6,131,149
[45] Date of Patent: *Oct. 10, 2000

[54] APPARATUS AND METHOD FOR READING DATA FROM SYNCHRONOUS MEMORY WITH SKEWED CLOCK PULSES

[75] Inventors: Manuel Lu, Fremont; Long Nguyen, Saratoga, both of Calif.

[73] Assignee: Oak Technology, Inc., Sunnyvale, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 09/274,568

[22] Filed: Mar. 23, 1999

Related U.S. Application Data

[63] Continuation of application No. 08/869,083, Jun. 4, 1997, Pat. No. 5,946,712.

[51] Int. Cl.[7] .................................................. G06F 12/00
[52] U.S. Cl. ........................... 711/167; 395/425; 395/551; 365/194; 365/233
[58] Field of Search ............................ 711/167; 395/425, 395/551, 558, 494; 365/194, 233

[56] References Cited

U.S. PATENT DOCUMENTS

| | | | |
|---|---|---|---|
| 4,739,277 | 4/1988 | Hollister et al. ........................... | 328/55 |
| 5,255,383 | 10/1993 | Lewis et al. .............................. | 395/425 |
| 5,560,000 | 9/1996 | Vogley ..................................... | 713/501 |
| 5,577,236 | 11/1996 | Johnson et al. .......................... | 395/551 |
| 5,608,896 | 3/1997 | Vogley ..................................... | 395/558 |
| 5,623,638 | 4/1997 | Andrade ................................... | 395/494 |
| 5,812,472 | 9/1998 | Lawrence et al. ....................... | 365/201 |
| 5,815,016 | 9/1998 | Erickson ................................. | 327/158 |
| 5,886,948 | 3/1999 | Ryan ....................................... | 365/233 |

FOREIGN PATENT DOCUMENTS 0 339 224 A2  3/1989  European Pat. Off. .......... G11C 7/00

OTHER PUBLICATIONS

PCT International Search Report Dated Sep. 10, 1998.

*Primary Examiner*—Do Hyun Yoo
*Assistant Examiner*—Mehdi Namazi
*Attorney, Agent, or Firm*—Steven F. Caserza; Flehr Hohbach Test Albritton & Herbert, LLP

[57] ABSTRACT

A novel apparatus and method is disclosed to assure validity of data accessed from synchronous memory during a "read" operation, wherein the synchronous memory is operating synchronously at a high frequency system clock. The invention comprises a programmable delay module which generates a skewed clock signal which is used to clock in data read from the synchronous memory. The programmable delay module generates the skewed clock signal by adding programmable time delays to the system clock signal. The inserted delay increases the data valid window time available for the "read" operation and allows sufficient setup and hold time for valid data to be read by a memory controller.

5 Claims, 5 Drawing Sheets

APPARATUS AND METHOD FOR READING DATA FROM SYNCHRONOUS MEMORY WITH SKEWED CLOCK PULSES

RELATED APPLICATIONS

This application is a continuation application of U.S. patent application Ser. No. 08/869,083; filed Jun. 4, 1997, now U.S. Pat. No. 5,946,712.

INTRODUCTION

1. Technical Field

This invention pertains to data processing systems using high performance synchronous memory architectures. More specifically, the invention concerns an apparatus and method to control the data access time of synchronous memory devices to ensure validity of data accessed at increased system clock frequencies.

2. Background

Advances in the fields of graphics imaging and video processing have generated a demand for high performance data processing systems with increased processor speeds and high performance memory architectures. Traditionally, processor speeds exceeded access speeds of random access memory (RAM) devices. As a result, while the processor ran synchronously with the system clock signal, RAM operated "asynchronously" with the system clock signal. This implied that the RAM device operated at a clock signal that was independent of, and slower, than the system dock signal. In such systems, even though the processor operated at increased speeds, the efficiency of data processing operations was limited by the slow speed of asynchronous memory operations.

The advent of synchronous high performance memory architectures has greatly reduced memory access times. In synchronous memory architecture systems the processor and RAM devices operate "synchronously" in response to a common system clock signal. This implies that both the processor and synchronous memory device are clocked by the same system clock signal. The use of the system clock increases the memory bandwidth and also decreases the memory access time.

FIG. 1 depicts a typical prior art data processing system 100 incorporating a high performance synchronous memory architecture. As shown in FIG. 1, data processing system 100 mounted on PC board 102 comprises processor 104 coupled to memory controller 106, which in turn is coupled to synchronous RAM 108. Processor 104, memory controller 106 and synchronous memory 108 work synchronously with system clock signal "sysclk" 110 generated by system clock 112.

Processor 104 receives memory access requests which are then forwarded to memory controller 106. Memory controller 106 controls access to synchronous memory 108 and is responsible for processing memory access requests received from processor 104. Memory controller 106 comprises controller clock circuit 114 which receives the "sysclk" system clock signal 110 generated by system clock 112, control signal logic circuit 116 which receives control signals 122 generated by processor 104 in response to a memory read/write command, address buffer 118 to store the memory address whose contents are to be read from or written to and data buffer 120 to store data read from synchronous memory 108. Due to the synchronous nature of the memory architecture, controller clock circuit 114 provides the system clock signal "sysclk" 110 to control signal logic circuit 116, address buffer 118 and data buffer 120 without any modification. Control signals 122 include signals such as the row address strobe (RAS), the column address strobe (CAS) and the read/write enable (RWEN/WEN) signals which are required to perform memory access operations. "Sysclk" system clock signal 110, control signals 122 and the memory address are routed to synchronous RAM 108 via pads 124a, 124b and 124c, respectively.

Synchronous memory 108 comprises memory clock circuit 126 which receives the "sysclk" system clock signal 110 from memory controller 106 via pads 124a and 134a, memory control signal logic circuit 128 which receives control signals from memory controller 106 via pads 124b and 134b, address decoder 130 which receives the memory address from memory controller 106 via pads 124c and 134c, and memory data buffer 132 which stores the memory contents. Due to the synchronous nature of the memory architecture, memory clock circuit 126 provides "sysclk" signal 110 to memory control signal logic circuit 128, address decoder 130 and memory data buffer 132 without any modification. Address decoder 130 parses the memory address into a row address component and a column address component. The row and column address components a along with the control signals received by memory control signal logic circuit 128a are forwarded to memory data buffer 132. In the case of a "read" control signal, data read from memory data buffer 132 corresponding to the row and column addresses is routed to data buffer 120 of memory controller 106 via pads 134d and 124d.

Although the synchronous RAM architecture depicted in FIG. 1 presents substantial improvements over asynchronous memory devices in the time required to access RAM, synchronous RAM devices are difficult to implement because the high system clock frequency greatly reduces the time available to complete a memory "read" operation. Due to the increased "sysclk" frequency, the time period ($t_{sysclk}$), which is the inverse of "sysclk" frequency, allocated for completion of a memory "read" command is very small. FIG. 2 depicts a "sysclk" system time signal timing diagram illustrating the time period ($t_{sysclk}$) available for completion of a synchronous memory "read" operation in a prior art system. In FIG. 2, the "read" command is issued by memory controller 106 at rising edge 134 of "sysclk" system clock signal 110. Memory controller 106 expects valid data read from synchronous memory 108 to be available at rising edge 136 of "sysclk" 110. The time interval between rising edge 134 and rising edge 136 represents the time period ($t_{sysclk}$) available for completion of the "read" operation.

Time period "$t_{sysclk}$" includes "routing access time" ($t_{rac}$) which represents the time required for the propagation of the "read" command signals through the various memory architecture components and "data valid window time" ($t_{dv}$) which represents the window of time when valid data read from memory data buffer 132 is available to be clocked in by memory controller 106 into data buffer 120. As shown in FIG. 2 (and FIG. 1), routing access time "$t_{rac}$" in turn is comprised of the following time delays summarized in Table 1:

TABLE 1

"Routing access time" delays

| Delay Period | Delay Name | Description of Delay |
|---|---|---|
| $t_{mcd}$ | Memory controller routing delay | This represents the time delay required to route the "read" command signals from memory controller 106 to pads 124a, b, c. |
| $t_{pcrd}$ | PC board routing delay | This represents the time delay required to route the "read" command signals on PC board 102 from pads 124a, b, c to pads 134a, b, c. |
| $t_{mrd}$ | Memory routing delay | This represents the time delay required to route the "read" command signals from pads 134a, b, c to memory clock circuit 126, memory control signal logic circuit 128 and address decoder 130, respectively. |
| $t_{macd}$ | Memory access delay | This represents the time delay required to access the contents of memory data buffer 132 in response to the row and column addresses provided by address decoder 130 and time delay required to route the data to pad 134d. |
| $t_{pcrd}$ | PC board routing delay | This represents the time delay required to route the data read from synchronous memory 108 from pad 134d to pad 124d on PC board 102. |
| $t_{dbrd}$ | Data buffer routing delay | This represents the delay required to route the data from pad 124d to data buffer 120 in memory controller 106. |

Due to the high frequency of system clock signal "sysclk" 110, the aggregate effect ($t_{mcd}+t_{pcrd}+t_{mrd}+t_{macd}+t_{pcrd}+t_{dbrd}$) of the time delays, which represents the total time required for the propagation of the "read" command signal through the various memory architecture components, becomes quite substantial with respect to overall time period "$t_{sysclk}$" available for the "read" command. Consequently, as shown in FIG. 2, the "data valid window time" ($t_{dv}$) is greatly reduced and does not represent enough setup and hold time for memory controller 106 to clock in the data. As a result, the validity of data read from synchronous memory device 108 by memory controller 106 cannot be assured.

For example, a 100 Mhz synchronous memory running synchronously with a 100 Mhz system clock has a time period ($t_{sysclk}$) of 10 nanoseconds to complete the "read" operation. The typical access time ($t_{mrd}+t_{macd}$) for such a memory device not including routing is approximately 9 nanoseconds. For example, the access of Synchronous Graphics RAM ("SGRAM") is about 9 nanoseconds. With such latency, the memory controller has less than 1 nanosecond left for setup and hold time ($t_{dv}$) on the data read from memory. Memory designers cannot guarantee the correctness of data at such reduced data valid window times. Typically, at least a 3 nanosecond data valid window time value ($t_{dv}$) is required to assure correctness of data. The problems are further aggravated when memory controller 106 interfaces with multiple synchronous memory modules or SIMMS. As the "load" of the memory system increases, the routing access delays ($t_{rac}$) become more pronounced, thus further reducing the data valid window time.

Prior art solutions to the above problem include using faster synchronous memory devices with slower system clock frequencies. For example, a 125 Mhz synchronous memory with a routing access time of 8 nanoseconds is used to run at 100 Mhz system clock. However, faster memories are expensive and consequently a price premium is imposed on the whole data processing system. Furthermore, using faster memories defeats the purpose of synchronous memories which is to provide a memory architecture which can operate synchronously with the system clock. Thus, it is desirable to provide an apparatus and method which guarantees validity of data accessed from synchronous memory operating at a high system clock frequency.

SUMMARY

In view of the foregoing, it is an objective of the present invention to provide an apparatus and method to assure validity of data accessed from synchronous memory during a "read" operation, wherein the synchronous memory is operating synchronously with a high frequency system clock. It is also an objective of the present invention to assure validity of data by increasing the data valid window time including the set up and hold time necessary for the memory controller to read data from the synchronous memory device. It is a further objective of the present invention to provide data processing system designers with the flexibility to use the present invention in combination with a variety of memory controllers and synchronous memory devices.

The present invention achieves the above goals and objectives by providing a novel apparatus and method which increases the data valid window time available for the "read" operation. Unlike prior art systems in which the data buffer used to store data read from memory is clocked by the system clock signal, in accordance with the teachings of the present invention, the data buffer is clocked by a skewed timing clock pulse generated by a programmable delay module. The programmable delay module generates the skewed clock signal by adding time delays to the system clock signal. Thus, the present invention extends the data valid window by a time amount equal to the delay added by the programmable delay module. The length of the delay is programmed to allow sufficient set up and hold time for the memory controller to clock in valid data. By adjusting the duration of the inserted delay, the timing for a memory controller can be tuned to meet the setup and hold time required by data buffer to read valid data. Additionally, the present invention provides system designers with the flexibility to alter the duration of the delay according to system specifications.

BRIEF DESCRIPTION OF THE DRAWING

Additional features of the invention will be readily apparent from the following detailed description and appended claims when taken in conjunction with the drawings, in which:

DETAILED DESCRIPTION OF EXEMPLARY EMBODIMENTS

In accordance with the teachings of the present invention, a novel apparatus and method is taught which assures validity of data read from synchronous memory devices operating at increased system clock frequencies. In particular, the present invention provides an apparatus and method which increases the data valid window time available for the "read" operation by inserting a clock delay which increases the setup and hold time for data read by the memory controller.

Figure 1:
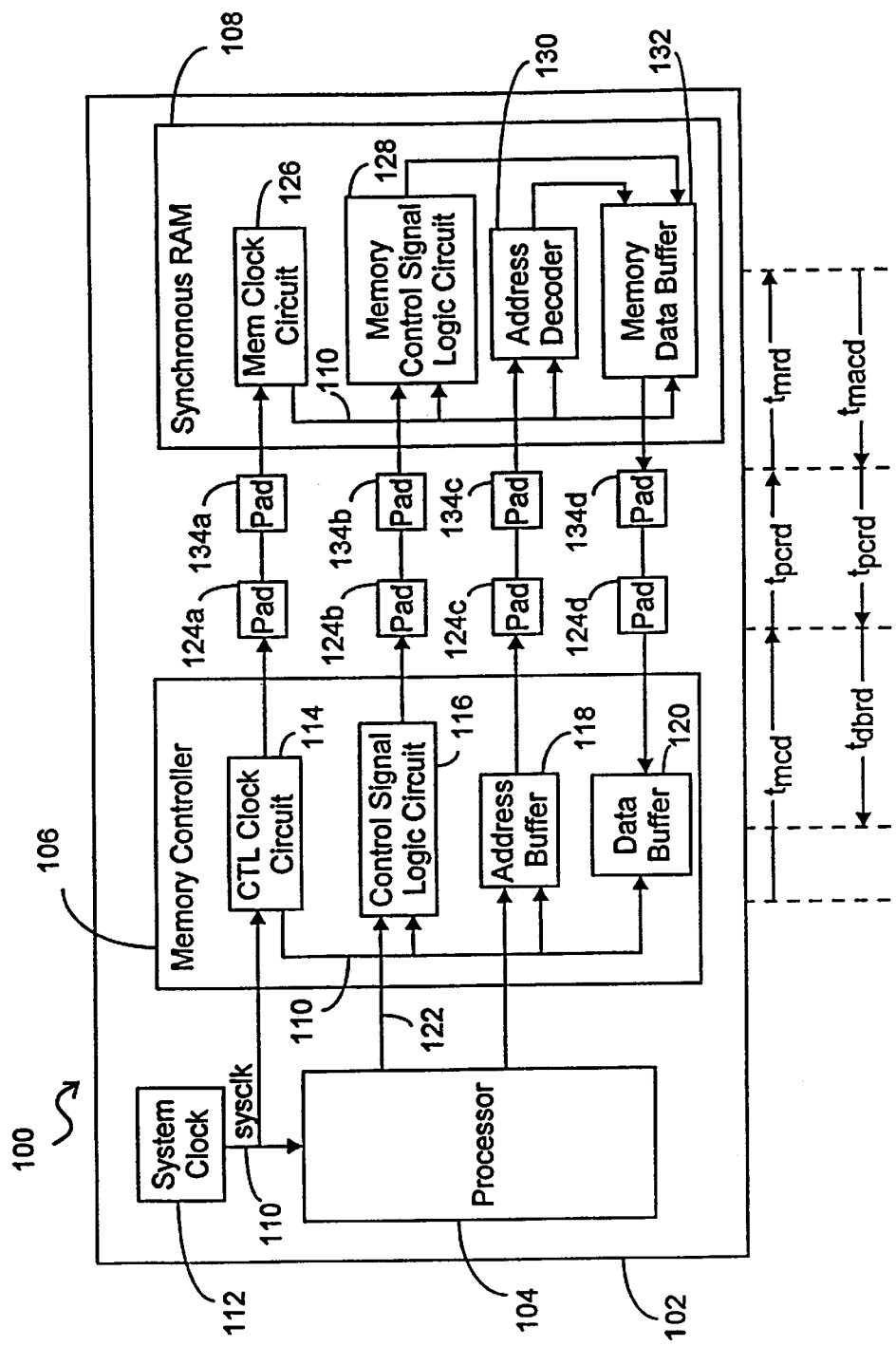
FIG. 1 is a block diagram depicting a typical prior art data processing system incorporating a high performance synchronous memory architecture.
Figure 2:
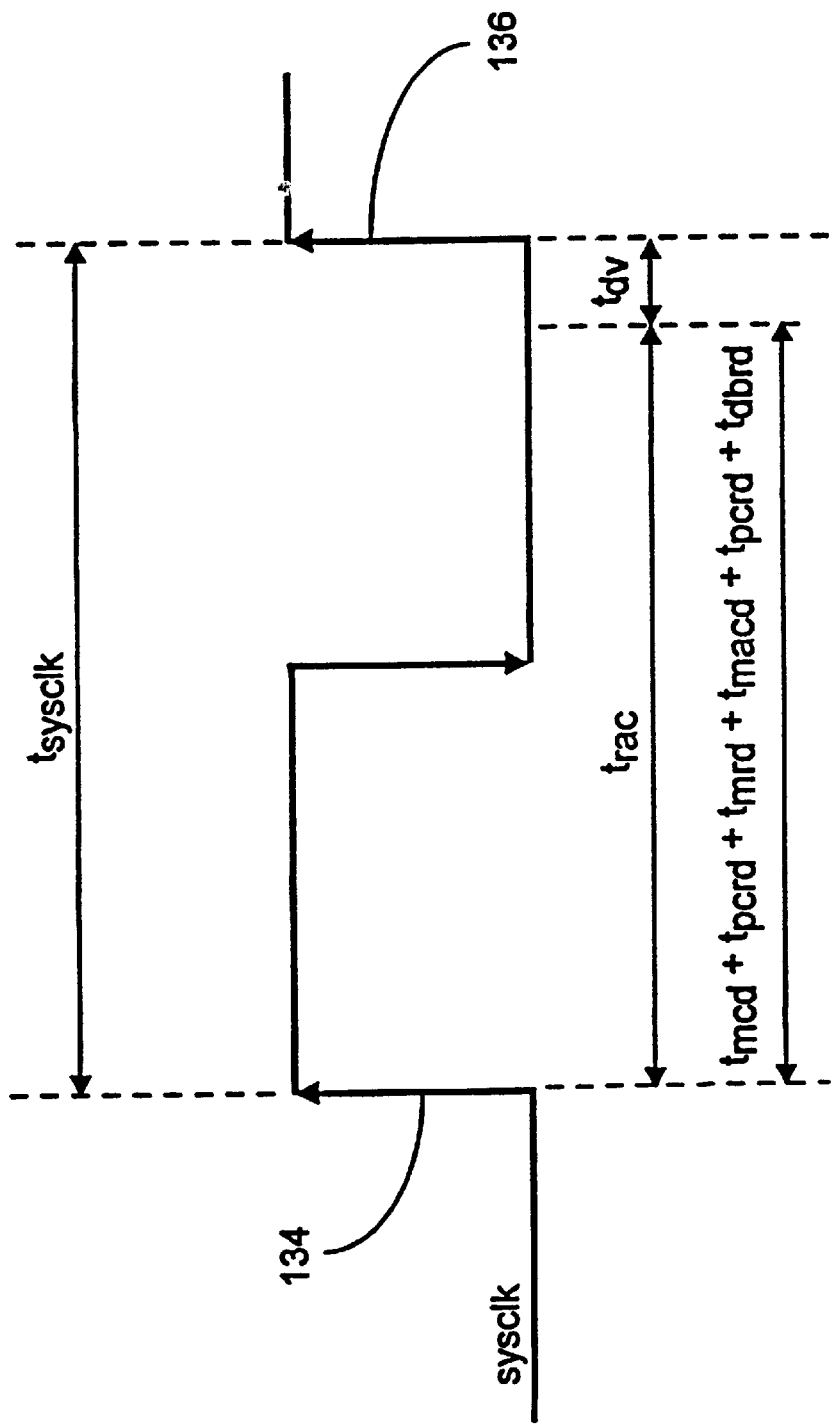
FIG. 2 depicts a timing diagram for a prior art data processing system illustrating the various time delays involved in accessing data from synchronous memory during a "read" memory operation.
Figure 3:
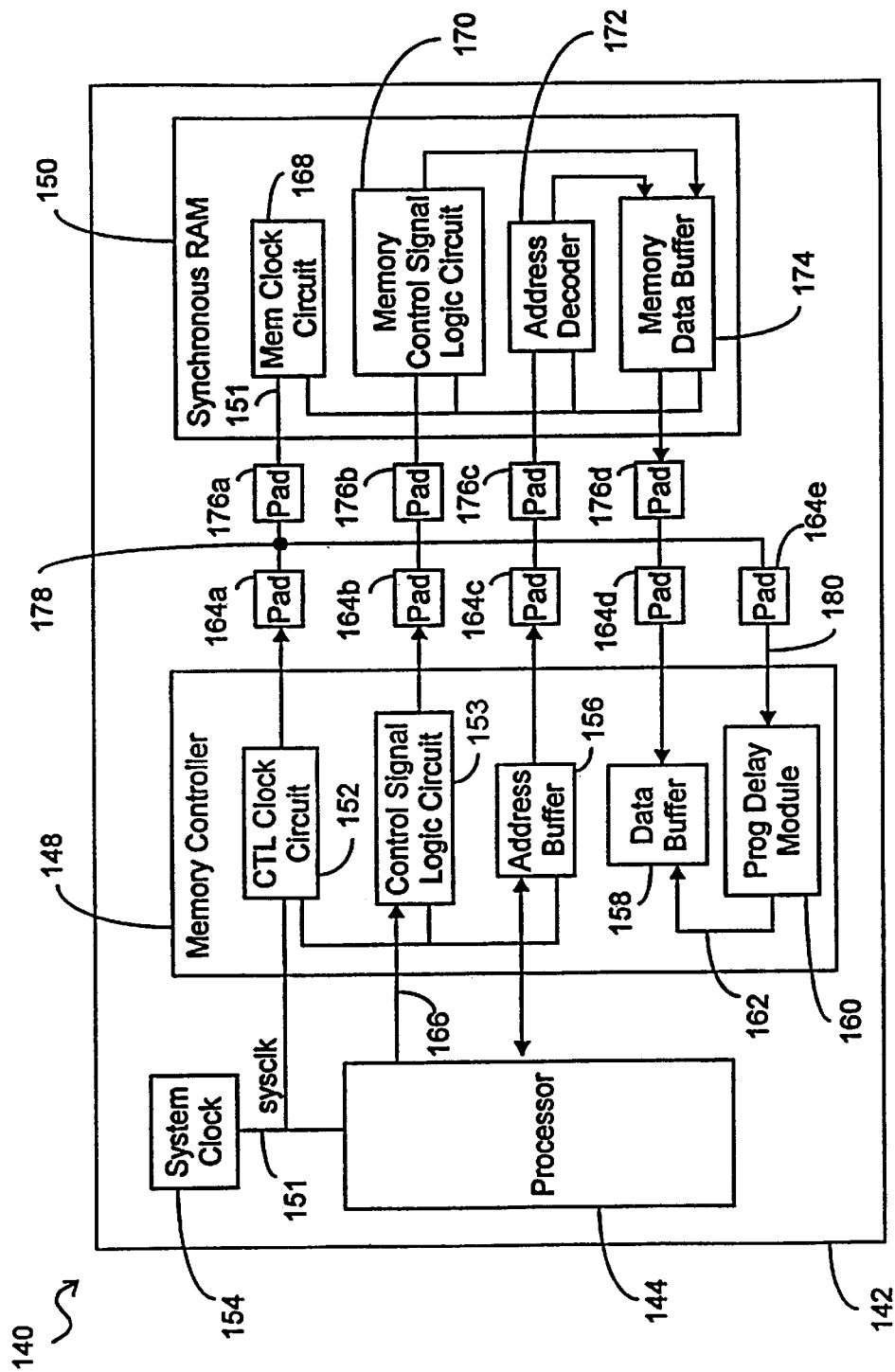
FIG. 3 is a block diagram depicting an embodiment of a data processing system constructed in accordance with the teachings of the present invention.

FIG. 3 depicts a data processing system 140 constructed in accordance with the teachings of the present invention. As shown in FIG. 3, data processing system 140, mounted on PC board 142, comprises processor 144 coupled to memory controller 148 which in turn is coupled to synchronous RAM 150. Processor 144, memory controller 148 and synchronous memory 150 work synchronously with clock signal "sysclk" 151 generated by system clock 154. As in prior art data processing systems, processor 144 receives memory access requests which are then forwarded to memory controller 148.

Memory controller 148 controls access to synchronous memory 150 and is responsible for processing memory access requests received from processor 144. Memory controller 148 comprises controller clock circuit 152 which receives system clock signal "sysclk" 151 generated by system clock 154, control signal logic circuit 153 which receives control signals 166 generated by processor 144 in response to a memory read/write command, address buffer 156 to store the memory address whose contents are to be read from or written to, data buffer 158 to store data read from synchronous memory 150, and programmable delay module 160 to provide a skewed timing signal ("skewclk") 162 to data buffer 158. Controller clock circuit 152 provides system clock signal "sysclk" 151 to control signal logic circuit 153 and address buffer 156 without any modification. Control signals 166 include signals such as the row address strobe (RAS), the column address strobe (CAS) and the read/write enable (RWEN/WEN) signals which are required to perform memory access operations. "Sysclk" system clock signal 151, control signals 166 and the memory address are routed to synchronous RAM 150 via pads 164a, 164b and 164c, respectively.

As in the prior art, synchronous memory 150 comprises memory clock circuit 168 which receives "sysclk" system clock signal 151 from memory controller 148 via pads 164a and 176a, memory control signal logic circuit 170 which receives control signals 166 from memory controller 148 via pads 164b and 176b, address decoder 172 which receives the memory address from memory controller 148 via pads 164c and 176c, and memory data buffer 174 which stores the memory contents. Due to the synchronous nature of the memory architecture, memory clock circuit 168 provides "sysclk" signal 151 to memory control signal logic circuit 170, address decoder 172 and memory data buffer 174 without any modification. Address decoder 172 parses the memory address into a row address component and a column address component. The row and column address components along with the control signals received by memory control signal logic circuit 170 are forwarded to memory data buffer 174. In the case of a "read" operation, data read from memory data buffer 174 corresponding to the row and column addresses is routed to data buffer 158 of memory controller 148 via pads 176d and 164d.

As mentioned above, data read from synchronous memory 150 is clocked into data buffer 158 in memory controller 148. However, unlike prior art systems in which data buffer 158 is clocked by system time control signal "sysclk" generated by the system clock, in accordance with the teachings of the present invention, data buffer 158 is clocked by a skewed timing clock pulse "skewclk" 162 generated by programmable delay module 160. "Skewclk" signal 162 is essentially "sysclk" signal 151 with a programmable delay added to it.

As shown in FIG. 3, input clock signal 180 of programmable delay module 160 is connected via pad 164e to PC board trace 178 relaying the system clock signal between connecting pads 164a and 176a. Programmable delay module 160 generates skewed clock signal "skewclk" 162 by adding time delays to input "sysclk" signal. The length of the time delays inserted by programmable delay module 160 increase the data valid window time ($t_{dv}$) such that the $t_{dv}$ value is large enough to ensure validity of data read by memory controller 148. Thus, programmable delay module 160 extends the time for the data read back path.

Figure 4:
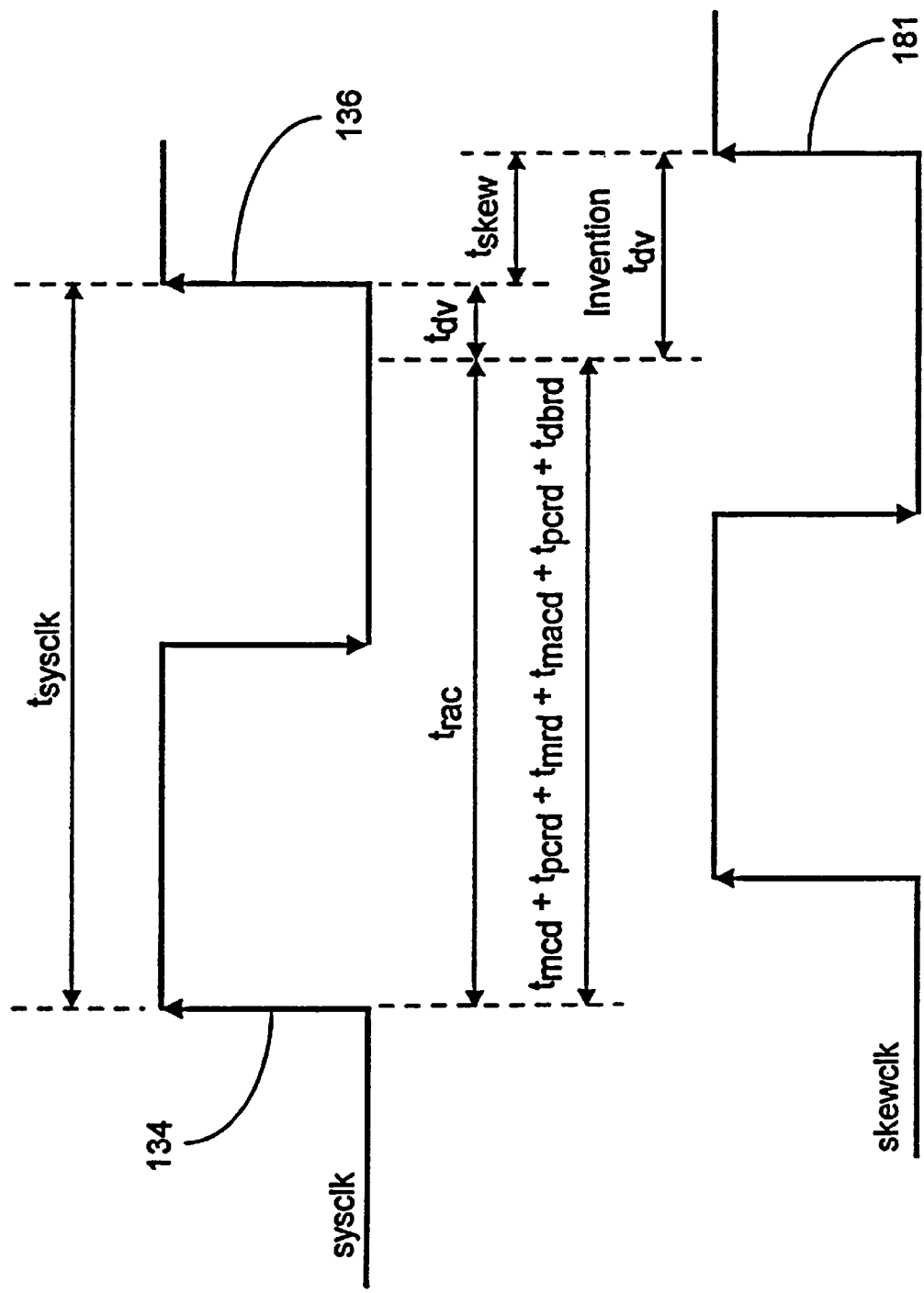
FIG. 4 depicts a timing diagram showing the increased data valid window time provided in accordance with an embodiment of the present invention.

FIG. 4 depicts a timing diagram showing the increased data valid window time provided in accordance with an embodiment of the present invention. As shown in FIG. 4, unlike prior art systems in which data read from memory has to be available at rising edge 136 of system clock signal "sysclk", in accordance with the present invention, valid data is clocked in by memory controller 148 at rising edge 181 of skewed timing signal "skewclk" generated by programmable delay module 160. Thus, the present invention extends the data valid window ($t_{dv}$) by a time amount equal to the delay ($t_{skew}$) added by programmable delay module 160. The length of $t_{skew}$ is programmed to allow sufficient set up and hold time for memory controller 148 to clock in valid data. By adjusting $t_{skew}$, the timing for memory controller 148 can be tuned to meet the setup and hold time required by data buffer 158 in memory controller 148. Factors used to determine the length of $t_{skew}$ value include the system clock frequency, speed ratings of synchronous memory 150, routing specifications of the PC board, and the memory "load" of the data processing system.

Figure 5:
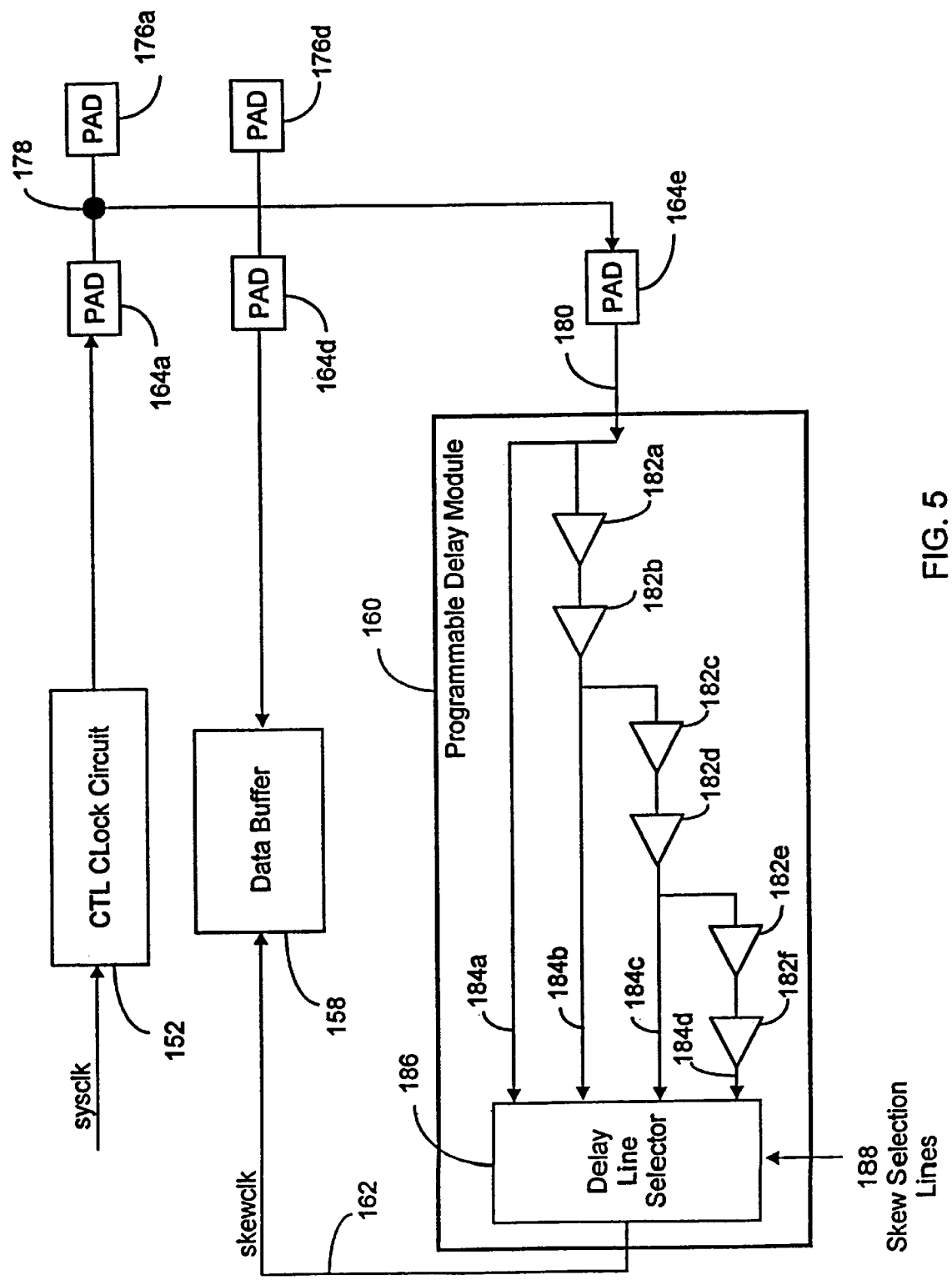
FIG. 5 is a block diagram depicting the internal structure of the programmable delay module according to one embodiment of the present invention.

FIG. 5 depicts the internal structure of programmable delay module 160 according to one embodiment of the present invention. As shown in FIG. 5, programmable delay module 160 comprises input signal 180, delay lines 184a, b, c, d comprising of delay elements 182a, b, c, d, e, f, delay line selector 186 and output signal "skewclk" 162. Input signal 180 is connected via pad 164e to PC board trace 178 relaying the system clock signal between connecting pads 164a and 176a. By connecting input signal 180 to trace 178, the embodiment of the present invention depicted in FIG. 4 takes advantage of time delay "$t_{mcd}$" required to route the system time signal "sysclk" from the memory controller to pad 164a. This reduces the value of $t_{skew}$ added by programmable delay module 160. However, it should be apparent to those skilled in the art that input signal 180 may be connected to any connector relaying the system time clock "sysclk" signal. In one embodiment, this connector is the trace from clock controller circuit 152 to pad 164a. The value of $t_{skew}$ can also be reduced by careful layout of the components of the data processing system to reduce capacitance between the lead connections on the PC board.

Delay elements 182a, b, c, d, e, f each add a finite amount of time delay to input signal 180. The value of $t_{skew}$ is directly proportional to the number of finite delays added by the delay elements. Thus, delay lines 184a, b, c, d represent lines of differing $t_{skew}$ values, with delay line 184a representing the minimum $t_{skew}$ value and line 184d representing the maximum $t_{skew}$ value. Delay line selector 186 determines which of the multiple delay lines is chosen as the "skewclk" signal and forwarded to data buffer 158. The selection of the appropriate delay line by delay line selector 186 is programmed using skew selection lines 188. As mentioned above, the appropriate value of $t_{skew}$ depends upon various factors such as system clock frequency, speed ratings of synchronous memory 150, metal trace layout specifications of the PC board, and the memory "load" of the data processing system. The present invention provides system designers with the flexibility to alter the $t_{skew}$ value using skew selection lines 188 depending on the above mentioned factors and other system requirements.

The invention now being fully described, it will be apparent to one of ordinary skill in the art that many changes and modifications can be made thereto without departing from the spirit or scope of the appended claims. All publications and patent applications mentioned in this specification are herein incorporated by reference to the same extent as if each individual publication or patent application was specifically and individually indicated to be incorporated by reference.

What is claimed is:

1. A data processing system for reading data from a synchronous memory device, said system comprising:
   a system clock to provide a system clock pulse signal;
   said synchronous memory device formed as a first integrated circuit and operating in response to said system clock pulse signal;
   a processor operating in response to said system clock pulse signal, said processor to provide a control signal and a memory address for reading data from said synchronous memory device; and
   a memory controller formed as a second integrated circuit and coupled to said processor, said memory controller including:
      an input port for receiving said system clock pulse signal;
      a control signal logic circuit operating in response to said system clock pulse signal, said control signal logic circuit to forward said control signal received from said processor to said synchronous memory device;
      an address buffer operating in response to said system clock pulse signal, said address buffer to forward said memory address received from said processor to said synchronous memory device;
      an output port for providing said system clock pulse signal to said synchronous memory device;
      a programmable delay module receiving said system clock pulse signal from said output port to generate a skewed clock pulse signal, said skewed clock pulse signal generated by adding a time delay to said system clock pulse signal received from said output port; and
      a data buffer coupled to said programmable delay module, said data buffer to read data from said synchronous memory device in response to said skewed clock pulse signal, thereby increasing a data valid window in order to ensure valid data is read by said memory controller.

2. The data processing system of claim 1 wherein said time delay added by said programmable delay module is at least 3 nanoseconds.

3. The data processing system of claim 1 wherein said synchronous memory device comprises a plurality of synchronous memory modules.

4. A method for reading data from a synchronous memory device formed as a first integrated circuit, said method comprising:
   generating a system clock pulse signal;
   causing a processor to generate a control signal and a memory address in response to said system clock pulse signal for reading data from said synchronous memory device;
   applying said system clock pulse signal to a memory controller formed as a second integrated circuit;
   causing said memory controller to:
      forward said control signal and said memory address to said synchronous memory device in response to said system clock pulse signal; and
      generate said system clock pulse signal to said synchronous memory device; generating a skewed clock pulse signal by adding a time delay to said system clock pulse signal forwarded to said synchronous memory device;
      forwarding said skewed clock pulse signal to a data buffer; and storing data from said synchronous memory device, in said data buffer, in response to said skewed clock pulse signal, thereby increasing a data valid window in order to ensure valid data is read by said memory controller.

5. The method of claim 4, wherein said time delay is at least 3 nanoseconds.

* * * * *